(12) United States Patent
Brudermann et al.

(10) Patent No.: US 7,974,321 B2
(45) Date of Patent: Jul. 5, 2011

(54) METHOD AND ARRANGEMENT FOR STABILIZING THE AVERAGE EMITTED RADIATION OUTPUT OF A PULSED RADIATION SOURCE

(75) Inventors: Jesko Brudermann, Goettingen (DE); Juergen Kleinschmidt, Goettingen (DE)

(73) Assignee: XTREME technologies GmbH, Jena (DE)

( * ) Notice: Subject to any disclaimer, the term of this patent is extended or adjusted under 35 U.S.C. 154(b) by 284 days.

(21) Appl. No.: 11/949,924

(22) Filed: Dec. 4, 2007

(65) Prior Publication Data

US 2008/0143989 A1 Jun. 19, 2008

(30) Foreign Application Priority Data

Dec. 16, 2006 (DE) .................. 10 2006 060 368

(51) Int. Cl.
*H01S 3/10* (2006.01)
(52) U.S. Cl. .................. 372/25; 372/26; 372/28
(58) Field of Classification Search .............. 372/25, 372/26, 28
See application file for complete search history.

(56) References Cited

U.S. PATENT DOCUMENTS

| 3,747,019 | A | * | 7/1973 | Koechner et al. ............ 372/30 |
| 4,804,978 | A | * | 2/1989 | Tracy ............ 347/246 |
| 5,107,275 | A | | 4/1992 | Tsuruoka et al. |
| 5,608,492 | A | * | 3/1997 | Sato ............ 355/68 |
| 5,677,754 | A | * | 10/1997 | Makinouchi ............ 355/53 |
| 5,776,127 | A | * | 7/1998 | Anderson et al. ............ 606/2 |
| 5,852,621 | A | * | 12/1998 | Sandstrom ............ 372/25 |
| 6,894,763 | B2 | * | 5/2005 | Murakami et al. ............ 355/53 |
| 2002/0076628 | A1 | | 6/2002 | Hanawa |
| 2003/0198263 | A1 | * | 10/2003 | Kleinschmidt ............ 372/25 |
| 2007/0127007 | A1 | | 6/2007 | Cormont et al. |

FOREIGN PATENT DOCUMENTS

| EP | 0957401 | 9/1996 |
| FR | 2859545 | 9/2005 |
| JP | 09190966 | 7/1997 |

* cited by examiner

*Primary Examiner* — Tod T Van Roy
(74) *Attorney, Agent, or Firm* — Frommer Lawrence & Haug LLP (57) ABSTRACT

The invention is directed to a method and an arrangement for stabilizing the average emitted radiation output of a pulsed radiation source. It is the object of the invention to find a novel possibility for stabilizing the average emitted radiation output of a pulsed radiation source which enables a reliable regulation even when there is no sufficiently reliable manipulated variable for influencing the emitted pulse energy ($E_i$). According to the invention, this object is met in that the individual pulse energy ($E_i$) of the current radiation pulse is measured, the deviation of the current individual pulse energy ($E_i$) from a previously determined target value ($E_0$) is determined, and the pulse interval ($\Delta t_{i+1}$) preceding the triggering of the next radiation pulse is controlled depending on the magnitude of the deviation between the current individual pulse energy ($E_i$) and the target value ($E_0$) of the pulse energy.

19 Claims, 6 Drawing Sheets

METHOD AND ARRANGEMENT FOR STABILIZING THE AVERAGE EMITTED RADIATION OUTPUT OF A PULSED RADIATION SOURCE

CROSS-REFERENCE TO RELATED APPLICATION

This application claims priority of German Application No. 10 2006 060 368.0, filed Dec. 16, 2006, the complete disclosure of which is hereby incorporated by reference.

BACKGROUND OF THE INVENTION a) Field of the Invention

The present invention is directed to a method and an arrangement for stabilizing the average emitted radiation output of a pulsed radiation source, particularly of an EUV source based on a gas discharge plasma (GDP) or a laser-produced plasma (LPP), an excimer laser, an $F_2$ laser, or another pulsed radiation source. Radiation sources of this type are preferably applied in semiconductor lithography for producing electronic circuits.

b) Description of the Related Art

In photolithography processes in the semiconductor industry, a mask (with the structure to be imaged) is projected in a reduced manner on the semiconductor substrate (wafer) in a scanner.

Aside from the characteristics of the optical system (numerical aperture, depth of focus, imaging aberrations of the lenses or mirrors), the quality of the photolithography process is essentially determined by how accurately the radiated radiation dose can be maintained. According to V. Banine et al. (Proc. SPIE Vol. 3997 (2000) 126), this dose stability (dose accuracy) is determined by:

a) pulse quantization
b) pulse-to-pulse stability, and
c) spatial stability of the emitting volume.

The pulse quantization a) is scanner-specific. The quantity of light pulses that can enter the moving slit during a scan can vary. A method for optimizing the pulse quantization is disclosed, for example, in U.S. Pat. No. 5,986,742 A. Quantities b) and c) are specific to the radiation sources themselves, Quantity c) is meaningful only for EUV sources based on detectable fluctuations in the radiation-emitting plasma.

In conventional present-day exposure processes, a mask which is illuminated by a special light source is imaged in a reduced manner on the wafer. Narrow-band excimer lasers with wavelengths of 248 nm and 193 nm are currently used as radiation sources for exposure. Further, systems based on $F_2$ lasers at 157 nm are in development, and the trend toward even shorter wavelengths continues at the present time through plasma-based EUV radiation sources with wavelengths of around 13 nm.

Every radiation pulse produces a radiation spot on the wafer surface which appears slightly displaced on the wafer surface from one pulse to the next due to a synchronous movement of the mask and the wafer. For each exposure of an exposure area (die), generally corresponding to a circuit, that is carried out on the wafer, the radiation source emits a predefined sequence of radiation pulses (burst), some of which pulses contribute to the total exposure of the photosensitive layer at a determined location on the wafer surface according to the speed of the movement, the reduction of the imaging optics and the size of the exposure area.

As regards dose stability (at a determined location on the surface of the wafer), chip manufacturers set extremely high demands on pulse-to-pulse stability. This is expressed in the standard deviation v of the current pulse energy from its average value or from a target value (set energy) of the pulse energy. Narrow-band excimer lasers in DUV lithography and VUV lithography require a dose stability of $\sigma_D < 1.5\%$, while EUV lithography even requires a dose stability of $\sigma_D < 0.3\%$.

These demands can only be met by means of an active regulation of the radiation output on a pulse-to-pulse basis. For this purpose, all of the previously known methods rely on a variation of the reference value of the individual pulse energy of the next pulse $E_{S,i+1}$ $$E_{S,i+1} = f(E_0, E_i, E_{i-1}, E_{i-2}, \ldots E_{S,i}, E_{S,i-1}, E_{S,i-2} \ldots, i+1, \ldots), \quad (1)$$

where $E_0$ is the required average individual pulse energy, $E_i$ is the actual energy of the preceding pulses, $E_{S,i}$ is the respective reference value of the individual pulse energy of the preceding pulses, i+1 is the number of the next pulse within the burst, and f( . . . ) is a mathematical relationship which describes how the next reference value is to be obtained from the above-mentioned values—that is, the implementation of the regulating algorithm to be used (e.g., PID regulation, etc.).

A method of this kind is presented, e.g., in U.S. Pat. No. 5,608,492 which describes a pulse-to-pulse energy regulation based on a closed control loop of light emission, light pulse energy measurement, determination of the charge voltage of the driving laser, and renewed light emission. Accordingly, it corresponds to the regulating principle expressed by Equation (1).

In this connection, it is left to the experience of the respective design engineer to produce a suitable relationship $g_n( \ldots )$ between the reference value of the energy for the next pulse $E_{S,i+1}$ and one or more suitable manipulated variables $S_{n,i+1}$ (e.g., the charge voltage in a gas discharge-operated radiation source):

$$S_{n,i+1} = g_n(E_{S,i+1}) \quad (2)$$

Additional relationships known to the system can be entered in the function(s) $g_n( \ldots )$ Examples have been described in other publications.

For example, DE 102 09 161 A1 discloses a regulating method for a pulsed radiation source which is capable of constantly re-determining the proportionality factor of a proportional regulation from the previous measured values for pulse energy and manipulated variable (charge voltage) thereby making the regulation more accurate.

U.S. Pat. No. 6,005,879 A describes a specific construction for an excimer laser system. In this case, the regulation is optimized by an improved knowledge of the relationship between charge voltage and the effect on the pulse energy of the laser. Accordingly, this regulation also falls under the general relationship $g_n( \ldots )$.

Further, DE 102 19 805 A1 states that regulation can also be carried out over more than one manipulated variable $S_{n,i+1}$ (in this case, charge voltage and gas pressure).

Other methods have been described, e.g., in DE 102 44 105 B3, which are directed to optimizing the regulation algorithm during the first pulses of a burst in order to compensate for transient effects in the initial phase.

All of the methods mentioned above are based on a conscious change in the reference value for the next radiation pulse. The particular publications differ only in the manner in which the next energy value is determined or in how the radiation source is controlled in order to match the next light pulse as closely as possible to the pulse energy target value.

U.S. Pat. No. 6,456,363 B2 discloses a device containing a pulse light source for emitting light pulses with varying light quantities. The intensities of the light pulses are measured and the intensity transmitted to the target (mask) is controlled by means of an adjustable light reducing unit.

U.S. Pat. No. 6,496,247 B2 describes an improved arrangement for this purpose in which the intervals between the light pulses are additionally taken into account by first carrying out a measurement of pulse energy and then calculating how many pulses are required for the required dose on the exposure area, and determining the speed of the scan over the mask and wafer from the timing of the pulses. When the scan speed is fixed, the light intensity is advantageously adjusted by fine filtering in such a way that no change in the quantity of pulses is required. On the other hand, if the average light quantity decreases, the number of pulses can be increased by one in order to achieve the necessary dose.

A similar procedure is also described in U.S. Pat. No. 6,538,723 B2, wherein after measuring the radiated pulse energy and determining the pulse frequency of the preceding pulses for the next pulse, the pulse energy is adapted so that the scan speed can remain the same.

The three publications cited above have the disadvantage that in order to adjust the required dose and achieve the required dose accuracy at a given scan speed and with a predetermined quantity of pulses in the window function of the exposed area, the pulse energy can be explicitly adapted only from the average pulse energy determined in the wafer plane. While the frequency of the radiation pulses is taken into account in order to ensure the required dose depending on the available pulse energy, a constant selection must be carried out for the exposure process in order to regulate exclusively the pulse energy by means of sensitively adapted variable extinction filters for maintaining the dose accuracy.

However, in many cases, a suitable dependable relationship $g_n(\ldots)$ which allows a fast pulse-to-pulse regulation of the pulse energy cannot be found. In particular, control of the charge voltage for the gas discharge, which is used in all of the above-cited regulating methods, may fail to work, for example, when the imaging characteristics of the optical system also influence the radiation intensity measured in the wafer plane.

Accordingly, particularly with plasma-based radiation sources which, aside from the temporal energy fluctuations, also have spatial fluctuations of the plasma, the otherwise good correlation between charge voltage and pulse energy is sensitively disrupted, so that an increase in the energy generated in the plasma by a spatial change in the plasma (e.g., due to the etendue limiting of the optical system) is lost on the way to the wafer. In such a case, regulation of the pulse energy through control of the charge voltage is not successful.

Further, the relationship $g_n(\ldots)$ required for successful regulation may be subject to time fluctuations which are not known to the regulating algorithm. This necessarily leads to additional inaccuracy in the regulation.

OBJECT AND SUMMARY OF THE INVENTION

It is the primary object of the invention to find a novel possibility for stabilizing the average emitted radiation output of a pulsed radiation source which enables a reliable regulation even when, with the available manipulated variables, there is no sufficiently reliable correlation between the manipulated variable and the expected value of the individual pulse energy for the next radiation pulse.

According to the invention, this object is met in a method for stabilizing the average emitted radiation output of a pulsed radiation source, particularly of excimer lasers, $F_2$ lasers and EUV radiation sources based on a hot plasma, by means of the following steps:
  the individual pulse energy of the current radiation pulse is measured,
  the deviation $\Delta E = E_i - E_0$ of the current individual pulse energy $E_i$ from a previously determined target value $E_0$ of the pulse energy is determined,
  the pulse interval preceding the triggering of the next radiation pulse is controlled depending on the magnitude of the deviation of the current individual pulse energy from the target value of the pulse energy.

In an advantageous manner, by means of a timely programming of a fast trigger, the greater the determined amount by which the current individual pulse energy falls below the target value of the pulse energy, the sooner the next pulse is triggered, and the greater the determined amount by which the current individual pulse energy exceeds the target value of the pulse energy, the later the next pulse is triggered.

The time interval between the next pulse and the current pulse is advisably determined using the average (nominal) repetition frequency $f_0$ of the radiation source, the required target value of the pulse energy, and the measured individual pulse energy of the current pulse by the calculation rule $\Delta t_{i+1} = E_i/(f_0 \cdot E_0)$.

It has proven advantageous for the method according to the invention when a lithography exposure system having a window function with no steeply rising or falling edges of radiation intensity is used for the wafer exposure, wherein the window function determines the quantity of individual pulses and the extent of their effect and how the radiation intensity of the individual pulses is spatially distributed along a scan axis on the wafer.

The window function is advisably defined from the spatial distribution of the radiation intensity of the individual pulse relative to the scan axis $w(x - x_0)$ as:

$$\int w(x - x_0) dx = 1,$$

where the location x is replaced by the product of scan speed v multiplied by time t, and the total radiation dose D at a determined location on the wafer is calculated as:

$$D = \int w(v \cdot t - v \cdot t_0) P(t) dt$$
$$= \sum w(v \cdot t_i - v \cdot t_0) E_i.$$

A Gauss function, a triangular function or a trapezoidal function can advisably be used as a window function over at least 30 pulses in an approximately equivalent manner.

To compensate for the overshoot or undershoot behavior of the pulse energy within the initial phase of a burst, the average radiation output in the current burst is advantageously applied using previously stored pulse energy values of at least one unregulated model burst, and the pulse intervals are calculated therefrom corresponding to the deviation from the adjustable average pulse energy.

In this connection, the pulse interval preceding the next pulse is preferably determined according to the following equation:

$$\Delta t_{i+1}(k) = \frac{1}{f_0} \cdot \frac{E_i(k)}{E_0} \cdot \frac{<E_{i+1}(j)>}{<E_i(j)>},$$

where averaged pulse energy values $<E_i(j)>$ of at least one unregulated model burst are used. However, averaged pulse energy values from a plurality of unregulated model bursts can also be used for $<E_i(j)>$.

An unregulated model burst is advisably recorded and stored beforehand under the same initial conditions and with the same burst pattern as the current burst to be regulated.

To this end, the model bursts are preferably generated and stored in a separate calibrating regime with a plurality of different initial conditions and rigidly predetermined burst patterns.

In order to record the pulse energy values of model bursts, the radiation generation unit is advantageously operated with rigidly predetermined values of the charge voltage and gas conditions.

In an arrangement for stabilizing the average emitted radiation output of a pulsed radiation source, particularly of excimer lasers, F2 lasers, or EUV radiation sources based on a hot plasma, comprising a radiation generation unit which generates radiation pulses at high pulse rates, a measuring unit for measuring individual pulse energy of every pulse, and a closed control loop for controlling influencing variables of the radiation generation unit which makes it possible to control the next pulse based on the pulse energy measurements of at least one preceding pulse, the object of the invention is further characterized in that a control unit is provided for regulating the pulse frequency and is connected to the measuring unit for measuring the pulse energy of the current pulse and has a control signal at the output, which control signal is generated based on a deviation of the measured individual pulse energy of the current pulse from a desired target value of the pulse energy and represents a measure for the interval between the next pulse and the current pulse, and in that a programmable trigger for quickly changing the time for triggering the pulse is arranged between the control unit and the radiation generation unit and can alter the time point of the triggering of the next pulse relative to the nominal pulse frequency depending on the output signal of the control unit.

The measuring unit is advantageously arranged in a separate measurement channel of the radiation generation unit, and at least the etendue of optical transmission systems which are provided between the radiation generation unit and a location where the radiation is applied is equivalently simulated in the separate measurement channel.

In another advisable variant, the measuring unit is arranged downstream of the optical transmission systems which are provided between the radiation generation unit and a location where the radiation is applied in order to acquire the true yield of pulse energy of the current pulse at the point of application.

In a lithography exposure system for semiconductor chip fabrication, the measuring unit is preferably arranged in the vicinity of the surface of a wafer to be exposed or a plane conjugate thereto.

The invention is based on the consideration that the radiation dose which arrives on the object (wafer) and for which very narrow fluctuation limits are dictated in semiconductor chip fabrication is not determined exclusively by the individual pulse energy emitted by the radiation generation unit but, rather, that certain characteristics of the exposure beam path, principally the bundle boundaries of the transmission optics, also play a crucial role. Accordingly, particularly in sources emitting their radiation from a pulsed generated plasma, substantial portions of the pulse energy are lost due to random spatial changes in the source location. However, these radiation losses in the optical light path are not proportional to the pulse energy emitted by the source module and therefore cannot be compensated by the otherwise reliable method of proportional regulation of the high voltage for the plasma generation. The use of other, or additional, controlled variables does not result in a causal reduction in dose fluctuations.

The invention solves this problem in that, rather than selecting the energy of an individual pulse as a controlled variable, it makes use of the time average of the radiation output (that is, of the quotient of pulse energy and the time interval preceding the following pulse) by adapting the time interval between two radiation pulses.

For purposes of an accurately dosed exposure in a lithography scanner, the average output of the radiation source must be maintained as constant as possible in the wafer plane, where the average radiation output is defined by:

$$\overline{P} = \frac{1}{t_{i+1} - t_i} \int_{t_i}^{t_{i+1}} P(t)\,dt. \tag{3}$$

At precisely the time range between the start of an individual pulse ti until precisely before the start of the next individual pulse $t_{i+1}$, this gives:

$$\overline{P_i} = \frac{1}{\Delta t_{i+1}} E_i, \tag{4}$$

where $E_i$ is the energy of the pulse in the interval and $\Delta t_{i+1}$ is the length of the time interval. This relationship shows that the average output $\overline{P}_i$ can be regulated by changing $\Delta t_{i+1}$ in the same way on a pulse-to-pulse basis as by changing $E_{S,i+1}$.

The invention makes it possible to stabilize the average output of a pulsed radiation source, particularly of excimer lasers, $F_2$ lasers, and EUV radiation sources based on gas discharge excitation or laser excitation, in such a way that a reliable regulation is carried out even when, with the available manipulated variables, there is no sufficiently reliable correlation between the manipulated variable and the expected value of the individual pulse energy. Further, the inventive solution delivers results that are appreciably more accurate because the adjustment of the trigger time is not subject to random disturbing variables within the framework of the required accuracy as it is when controlling the influencing variables for radiation generation for adapting the individual pulse energy.

The invention will be described more fully in the following with reference to embodiment examples.

DESCRIPTION OF THE PREFERRED EMBODIMENTS

Figure 1:
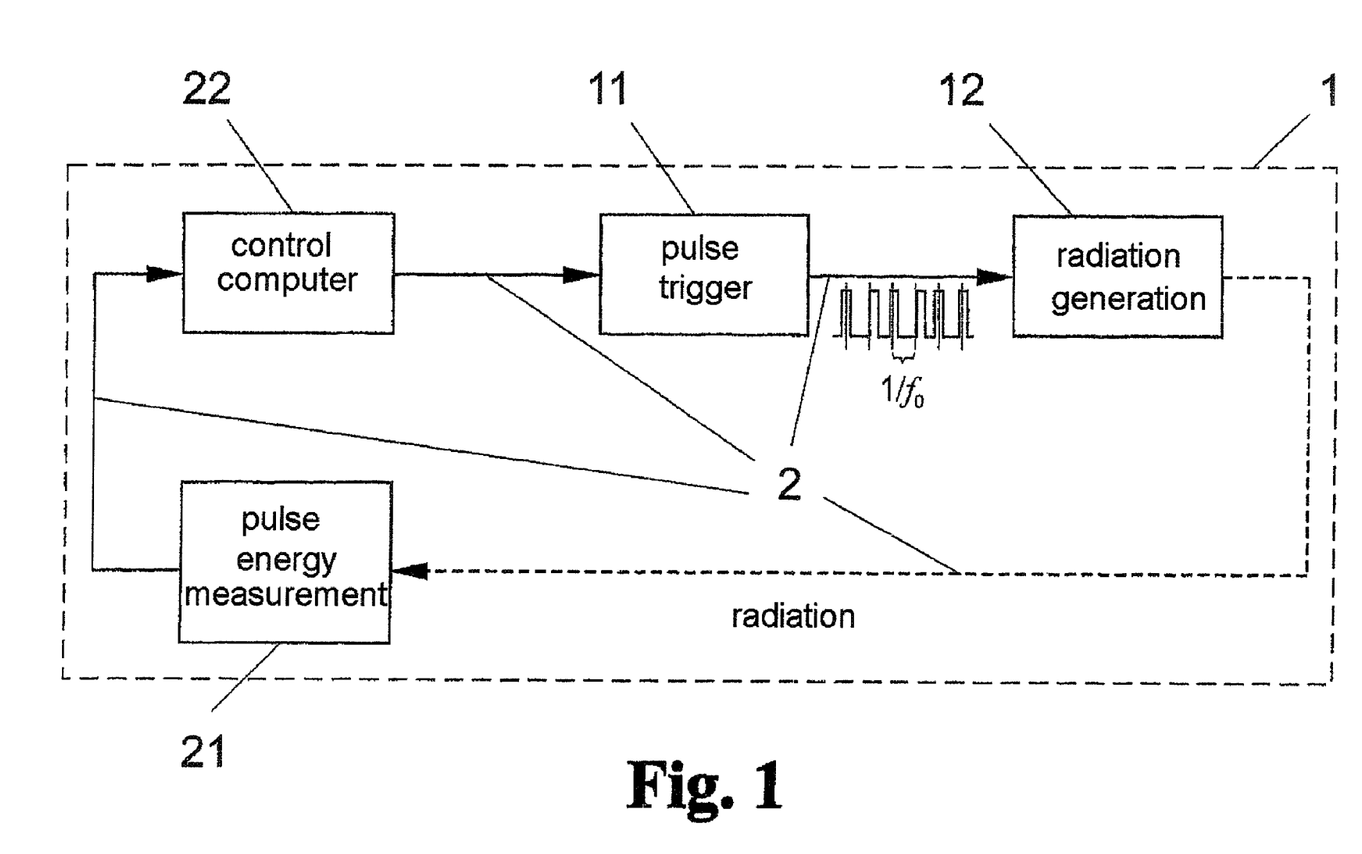
FIG. 1 shows a block diagram of the method according to the invention.
Figure 2:
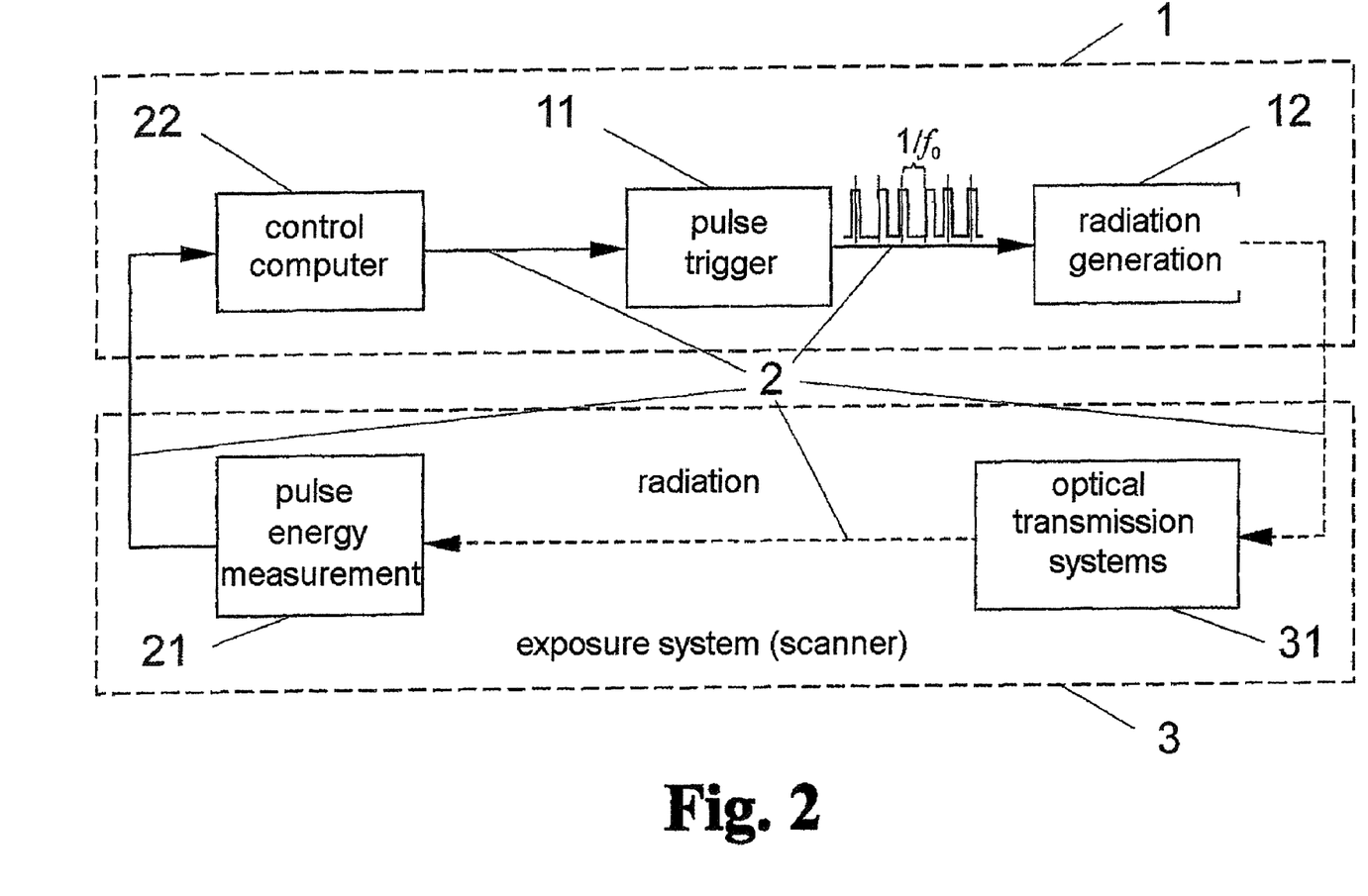
FIG. 2 shows a block diagram of the method according to the invention in which the measurement of the pulse energy is carried out at the location of exposure in the exposure system (after passing through a plurality of optical systems)

As can be seen from the regulation overviews in FIG. 1 and FIG. 2, the method for stabilizing the average emitted radiation output of a pulsed radiation source, preferably of excimer lasers, F2 lasers, or EUV radiation sources based on a hot plasma, comprises the following steps:

measurement of the individual pulse energy $E_i$ of the current radiation pulse, determination of the deviation $\Delta E = E_i - E_0$ of the current individual pulse energy $E_i$ from a previously determined target value $E_0$ of the individual pulse energy, control of the pulse interval $\Delta_{ti+1}$ leading up to the triggering of the next radiation pulse depending on the magnitude of the deviation of the current individual pulse energy $E_i$ from the target value $E_0$.

By programming the fast trigger 11, the greater the determined amount by which the current individual pulse energy $E_i$ falls below the target value $E_0$ of the individual pulse energy, the sooner the next pulse is triggered, and the greater the determined amount by which the current individual pulse energy $E_i$ exceeds the target value $E_0$ of the individual pulse energy, the later the next pulse is triggered. The trigger 11 is adjusted to the preselected average repetition frequency $f_0$ when the target value $E_0$ is reached.

For this purpose, the time interval $\Delta_{ti+1}$ between the next pulse and the current pulse is determined in the control unit 22 using the average repetition frequency $f_0$, the required target value $E_0$ of the pulse energy, and the measured individual pulse energy $E_i$ of the current pulse by the calculation rule $\Delta t_{i+1} = E_i/(f_0 \cdot E_0)$.

As is shown in FIG. 1, a closed control loop 2 is implemented in the radiation source 1 to regulate the average radiation output of the radiation source 1. In this instance, the essential difference with respect to conventional regulations of gas discharge-operated radiation sources which preferably control the charge voltage is the interface of the control unit 22.

In all of the prior known methods, a control computer sends the determined value of the charge voltage to a programmable high-voltage pulse generator. By contrast, in the invention the results of the energy measurement at the output of the measuring unit 21 are used for calculating a changed pulse interval $\Delta_{ti+1}$ in the control unit 22 in order to trigger the programmable trigger 11 which initiates the next pulse of the radiation generation unit 12 of the radiation source 1 with a delay in time or earlier in time.

According to FIG. 1, the control loop 2 comprises at least the following components:

a) a measuring unit 21 for measuring the individual pulse energy, containing a radiation-sensitive sensor and a measurement converter for converting the measured value into a data format that can be processed by a control computer;

b) a control unit 22 (control computer) for carrying out the regulating algorithm;

c) a programmable trigger generator 11 which carries out the variable precisely timed triggering of the next individual pulse;

d) a radiation generation unit 12 for generating the radiation-emitting plasma, e.g., a discharge unit of a gas discharge-operated EUV radiation source 1; and e) an optical path from the radiation source 1 to the measuring unit 21.

Depending on the implementation of the control loop 2, it is possible to carry out the measurement of the individual energy pulse selectively directly at the radiation source 1 (FIG. 1) or to arrange it outside the radiation source 1, e.g., inside a lithography exposure system 3 (scanner) (FIG. 2). To this end, the measuring unit 21 lies in a plane conjugate to the wafer surface and determines the emitted radiation energy of the individual radiation pulses. According to the construction shown in FIG. 2, the influences of the optical transmission system 31 used between the radiation source 1 and the mask to be imaged and the wafer surface are also taken into account in particular.

Figure 3:
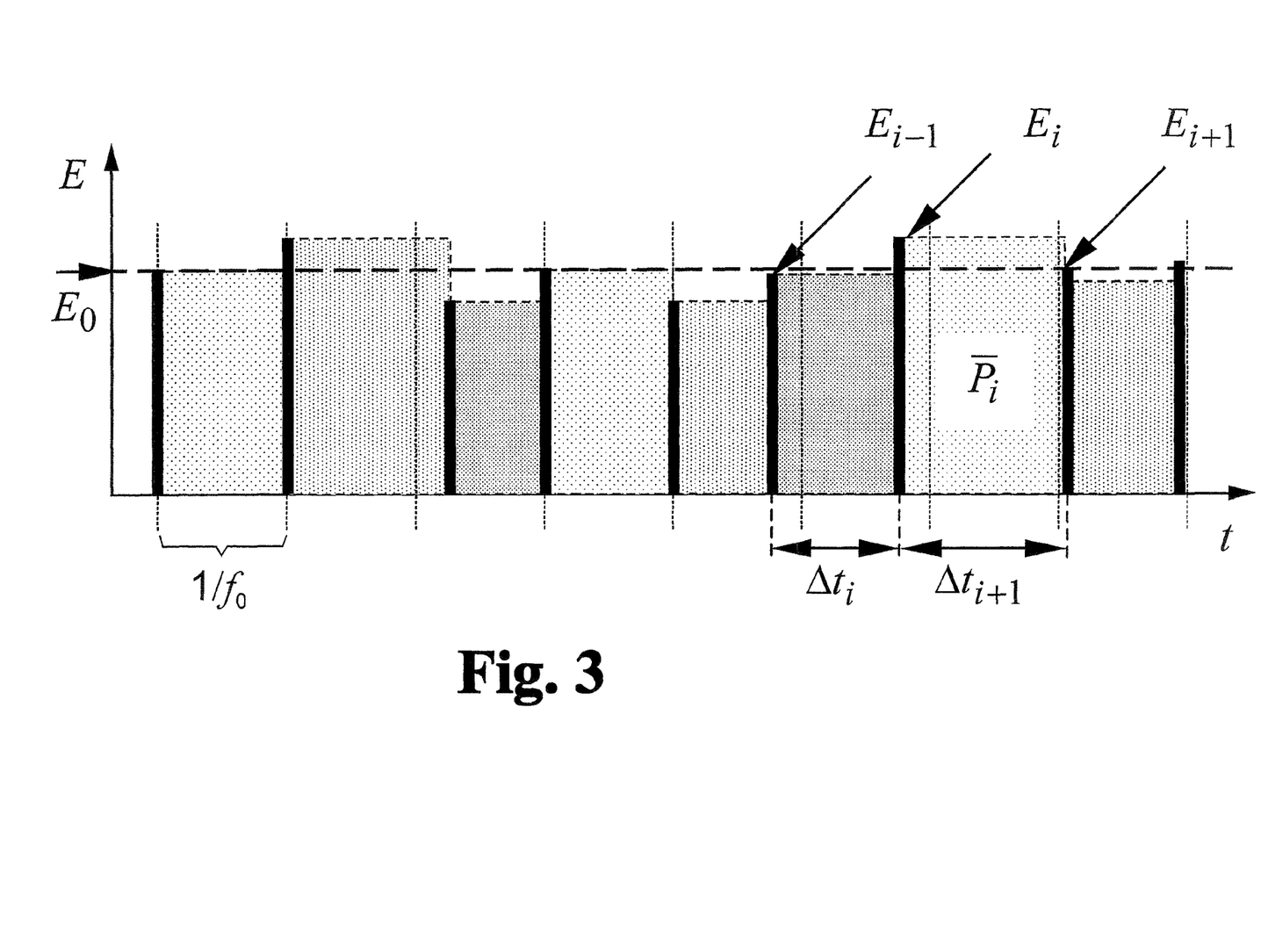
FIG. 3 illustrates the regulating principle, according to the invention, for compensating for fluctuations in pulse energy through an adapted retardation of the pulse triggering depending on the deviation of the pulse energy from the target value.

The essential regulating principle is illustrated schematically in FIG. 3 which shows the pulse energy over the time axis. Starting from a desired average repetition frequency $f_0$ of the radiation pulses of the radiation source 1, the pulse interval $\Delta t_i$ between two pulses is controlled depending on the magnitude of the deviation of the radiation energy $E_i$ of the current pulse from the predetermined target value $E_0$ of the pulse energy by calculating an adapted pulse interval $\Delta t_{i+1}$ until the next pulse is triggered with a pulse energy $E_{i+1}$.

The greater the extent to which the pulse energy $E_i$ of the current pulse falls short of the target energy value $E_0$, the shorter the resulting pulse interval $\Delta t_{i+1}$. The greater the extent to which the current pulse energy $E_i$ exceeds the target energy $E_0$, the longer the resulting pulse interval $\Delta t_{i+1}$. If the target energy $E_0$ was maintained in the current pulse, the pulse interval is adjusted by $1/f_0$ to the desired average repetition frequency $f_0$.

When this method is applied, the dose stability that can be achieved on the wafer is determined by a window function of the exposure system 3. The window function defines how many individual pulses will contribute to what degree to the total radiation amount at a determined location on the wafer and describes the spatial distribution of the radiation intensity of an individual pulse along the scan axis $w(x-x_0)$.

By definition, the window function is:

$$\int w(x-x_0)dx = 1.$$

Since the location x can be converted to a time using the scan speed v by the equation $x = v \cdot t$, the total radiation dose D at a determined location on the wafer is determined by $$D = \int w(v \cdot t - v \cdot t_0)P(t)dt \qquad (5)$$
$$= \sum w(v \cdot t_i - v \cdot t_0)E_i,$$

depending on whether a continuously illuminating radiation source or a pulsed radiation source is considered.

Since it is time-consuming and difficult to determine the dose error from the noise in an exact statistical manner, the dose error can also advantageously be determined by a digital simulation of a radiation source 1 regulated by the method according to the invention.

In the simulation, the sequence of all $E_i$ and $t_i$ is determined first and then, using equation (5), the dose occurring in this instance is determined depending on the location on the wafer D(x) or D(v·t). Therefore, the dose stability $\sigma_D$ is given as a mean square deviation of the dose from the reference value $D_0$:

$$\sigma_D = \frac{1}{x}\sqrt{\int (D(x) - D_0)^2 dx}. \quad (6)$$

The regulating algorithm that is used comes into play as an important factor for the accuracy of the exposure dose. In an advantageous manner, it is selected in such a way that it (a) achieves the highest possible stability of the dose, and (b) requires as little computing power as possible in the control unit 22.

A simple version of a PI controller which attempts to compensate for the error of the preceding pulse in the next respective pulse is advantageously used. Therefore, the following formula is given for the regulation algorithm:

$$\begin{aligned}\Delta t_{i+1} &= \Delta t_0 + \Delta(\Delta t_i) \quad (7)\\ &= \Delta t_0 + \Delta t_0 \cdot \frac{E_i - E_0}{E_0}\\ &= \Delta t_0 \cdot \frac{E_i}{E_0}\\ &= \frac{i}{f_0} \cdot \frac{E_i}{E_0}.\end{aligned}$$

The pulse interval $\Delta t_{i+1}$ preceding the next pulse can therefore be obtained directly from the desired average repetition frequency $f_0$ of the source, the pulse energy of the last pulse $E_i$ and the desired reference value for the individual energy pulse (target energy $E_0$).

FIG. 3 shows how the method affects the time interval of pulses. When the measured individual energy pulse $E_i$ exceeds the selected target energy $E_0$, the time interval $\Delta t_{i+1}$ preceding the next pulse is longer than when the emitted pulse energy is too low. The average output $\overline{P}_i = E_i/\Delta t_{i+1} = E_0 \sim f_0$ is maintained constant.

Figure 4:
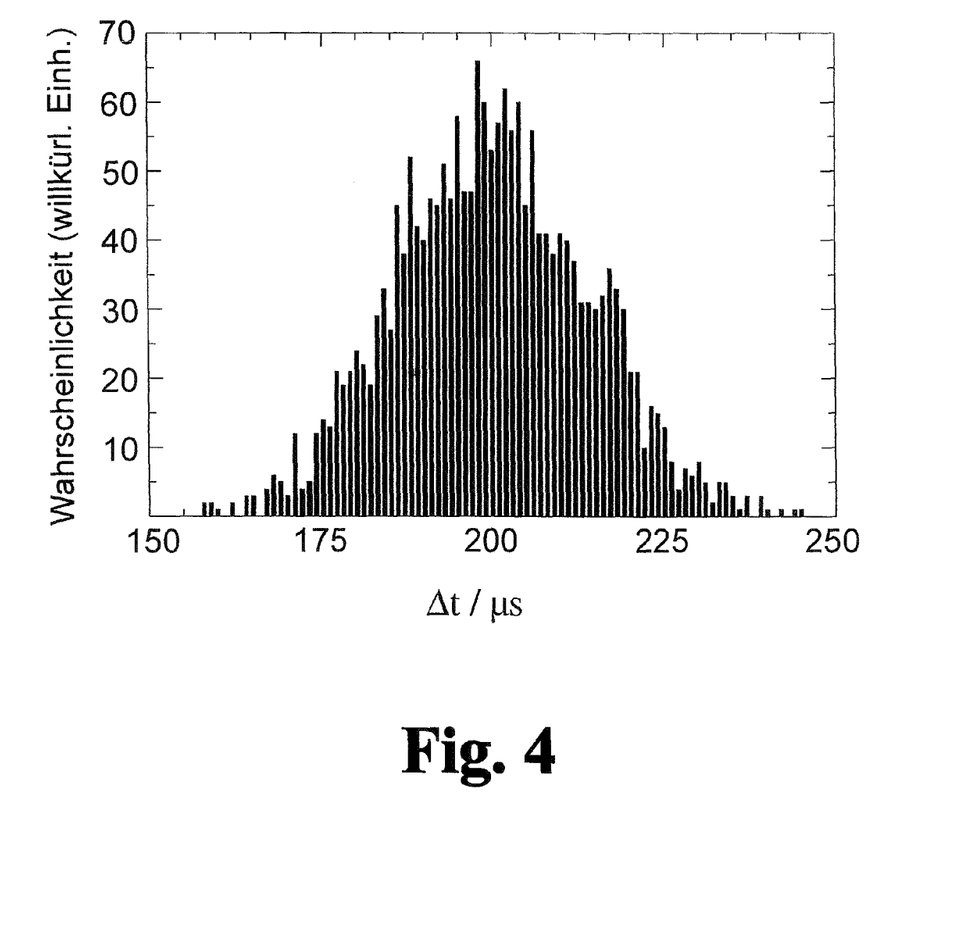
FIG. 4 shows a resulting distribution of the time intervals between the pulses (retardation) in a source with a standard deviation of the pulse-to-pulse energy of σ=7% and an average repetition frequency of 5 kHz.

For purposes of illustration, the method was applied to a radiation source 1 with a standard deviation of the pulse-to-pulse energy fluctuations of $\sigma = 7\%$ and a nominal repetition frequency $f_0$ of 5 kHz. The resulting distribution of the time intervals between the pulses is shown in FIG. 4.

Further, the dose accuracy was determined as the result of the indicated regulation for different window functions and compiled in Table 1.

The window function is a characteristic of the lithography exposure system 3 (scanner) and corresponds physically to the cross section of the radiation intensity of an individual pulse on the wafer surface along the scan axis in relation to the scan speed. The width of the illuminated spot on the wafer is influenced by the scan speed and by the time interval between two pulses by the relationship x=v·t. The window function that is used abstracts the intensity distributions of the individual radiation pulses and the degree to which they overlap during the given scan movement on the wafer surface.

When the radiation intensity of an individual pulse is low (and/or the sensitivity of the photosensitive layer on the wafer is low), the scan speed must be reduced (and/or the nominal repetition frequency $f_0$ of the pulses must be increased) until a sufficient quantity of radiation pulses contributes to the exposure of a location on the wafer. In present-day lithography scanners (exposure systems 3), window functions with several tens to several hundreds of pulses are common.

At the current time, window widths from 50 pulses onward are suitable for EUV radiation sources based on a gas discharge. When $F_2$ lasers and excimer lasers are coupled in, smaller window widths of the window function (upward from 30 pulses) can be used.

The time width of the window functions in the simulations on which Table 1 is based is selected in such a way that the energy of exactly 50 individual pulses (at a nominal repetition frequency $f_0$) contributes to the total dose, that is, 50/$f_0$, in all cases. When the window function has a width of 50 pulses, this means that two successive radiation pulses generate two illuminated spots on the wafer which appear to be displaced by 1/50 of the spot size.

On statistical grounds, it is expected in this case that the dose stability will be improved by a factor of $\sqrt{50}$, that is, about 0.990% dose stability, even with an unregulated radiation source, exclusively by averaging, as is shown by the first line of the following Table 1 compared to different types of window functions.

TABLE 1

Comparison of different window functions

| Window function | | Dose stability $\sigma_D$ Regulation of $\Delta t_i$ | Regulation of $E_i$ |
|---|---|---|---|
| sliding average 50 pulses | | 0.990% | |
| rectangular | ⎍ | 0.829% | 0.203 |
| Gaussian | ⌒ | 0.033% | 0.052 |
| triangular | ⋀ | 0.014% | 0.034 |
| trapezoidal 1/3-1/3-1/3 | ⏢ | 0.020% | 0.048 |

Table 1 shows the simulation results with the regulation according to the invention and with a conventional regulation for different types of window functions. It is clear that the advantages of the regulation by controlling the pulse interval $\Delta t_{i+1}$ have an effect particularly in window functions with sloping edges such as, for example, the Gaussian, triangular and trapezoidal functions.

Since the rectangular function is not a realistic exposure function in any case, regulation of the pulse repetition frequency is superior to the conventional method for regulating pulse energy for real, conventional window functions. This is particularly true of the trapezoidal function described in the last line of Table 1 which is the function principally used in modem scanning.

Direct comparison with the conventional pulse-to-pulse energy stabilization (with a similarly simple regulation rule $E_{S,i+1} = E_0 + E_{,Si} - E_i$) proves that the regulation of the pulse interval $\Delta t_{i+1}$ (with the exception of the rectangular window function) delivers comparable results or even better results. However, for plasma-based radiation sources in which a fluctuation of the source location cannot be ruled out, it represents the only effective regulation for stabilizing the radiation dose.

Figure 5:
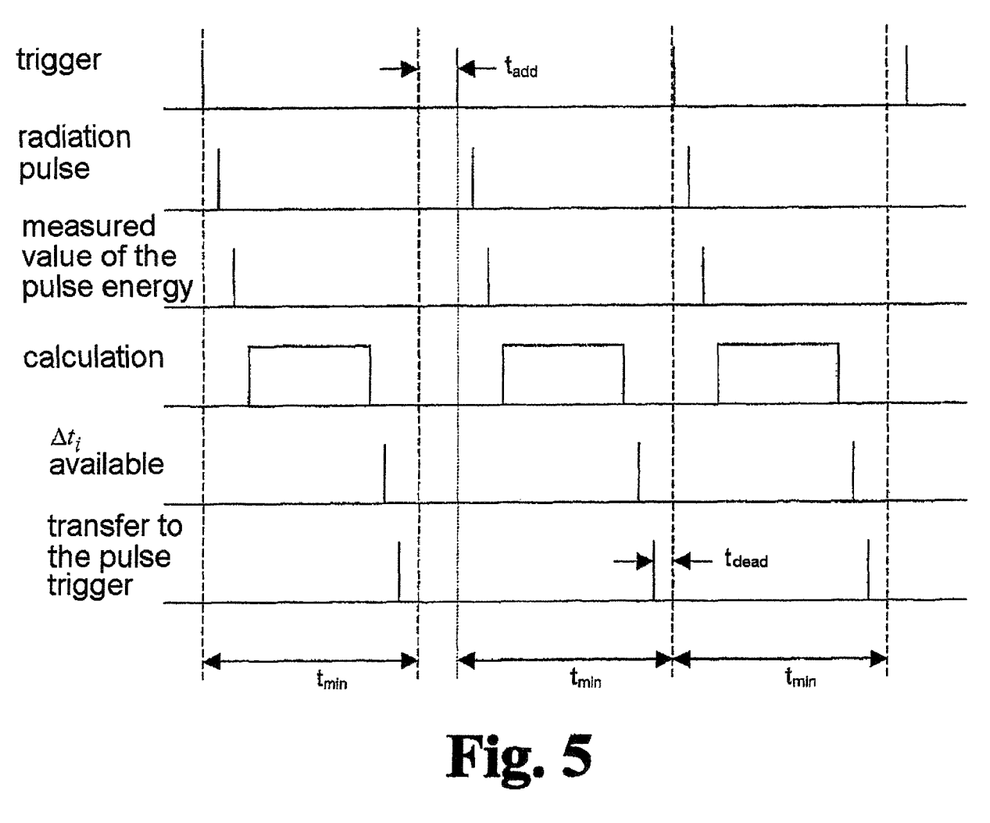
FIG. 5 is a schematic illustration of the timing for the control, according to the invention, of the variable triggering of the radiation pulses.

A requirement imposed on the programmable trigger 111 by the method according to the invention is that it also must still be possible to change the triggering time shortly before the next pulse is triggered. For this purpose, the lead time required internally by the trigger 11 before the next trigger pulse can be emitted in an accurately timed manner must be as short as possible. In FIG. 5, this lead time is indicated by the internal input dead time $t_{dead}$ of the trigger 11.

The time interval $t_{min}$ designates the minimum adjustable time period between two radiation pulses. It is determined by the processing time (radiation pulse, energy measurement, calculation of the adapted pulse interval $\Delta t_{i+1}$, programming of the trigger 11) and the maximum repetition frequency of the radiation generation unit 12 of the radiation source 1.

The preselected average pulse interval $\Delta t_i = 1/f_0$, that is, the pulse interval $\Delta t_i$ (for adjusting the optimal operating regime of the radiation generation unit 12) determined by the nominal pulse frequency $f_0$, must always be somewhat greater than $t_{min}$ so that the pulse interval $\Delta t_{i+1}$ can also be shortened. These temporal relationships are shown in FIG. 5.

Accordingly, the average pulse interval $\Delta t_i = 1/f_0$ must be formulated as follows:

$$\overline{\Delta t_{i+1}} = t_{min} + \overline{t_{add}},$$

where an added time $\overline{t_{add}}$ must be selected in such a way that the minimum time interval $t_{min}$, i.e., $t_{add} = 0$, is applied only in case of the maximum expected "underexposure" (greatest negative deviation of the pulse energy $E_i$ of the current pulse from the given target energy $E_0$ of the individual energy pulse).

Although the invention was described in the indicated examples with reference to gas discharge-operated EUV radiation sources, it can also be applied in an equivalent manner to any radiation sources which are operated in pulsed mode, particularly laser-based EUV sources, excimer lasers, and $F_2$ lasers.

Further, the invention is not limited to the simple relationship $\Delta t_{i+1} = E_i/(f_0 \cdot E_0)$ selected in the examples, but rather covers any regulating algorithm which calculates the time period preceding the next radiation pulse from the measured individual energy pulse and other known or measured system variables in order to adjust the average pulse energy to the desired target value (expected value) of pulse energy. Accordingly, the invention is applicable to any regulation relationships in which a target value of the average (radiation) output is achieved by changing the pulse intervals.

The control of the dose proposed herein by means of the pulse time interval $\Delta t_i$ between two pulses can also be used in the same way to compensate for overshoot and undershoot in the average radiation output $\overline{P}_i(k) = E_i(k)/\Delta t_{i+1}(k)$ (according to Equation (4)) within a current burst k.

All of the pulse energy values $E_i(k)$, $E_i(j)$ mentioned in the following relate to pulse energies that are measured by suitable means near the wafer plane or a conjugate plane. For this purpose, e.g., starting from a model burst j (or an average model burst <j>), the $\Delta t_{i+1}(k)$ values are calculated as follows according to equation (8):

$$\Delta t_{i+1}(k) = \frac{1}{f_0} \cdot \frac{E_i(k)}{E_0} \cdot \frac{<E_{i+1}(j)>}{<E_i(j)>}. \quad (8)$$

Equation (8) is a modification of Equation (7).

A model burst j is generated in a separate calibrating mode of the radiation source (generally, without exposure of a wafer) with burst patterns typical for exposure, and its pulse energy values $E_i(j)$ are stored. The calibrating mode can then be carried out multiple times in order to calculate average pulse energy values $<E_i(j)>$. The advantage in using an average model burst <j> consists in that pulse energy values can also be interpolated in times between the actual pulses and made available with a sufficiently high prediction probability. A model burst j of this type, which has the same antecedent (e.g., length of the preceding burst pause) as the current burst k, is advisably used for the current burst to be regulated.

Figure 6A:
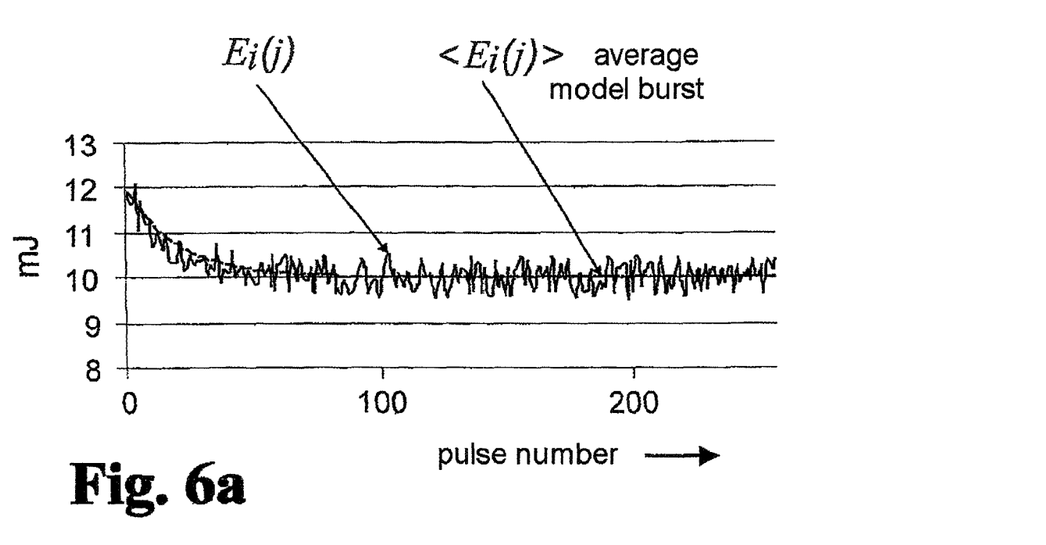
FIG. 6a shows a measurement graph of the pulse energy of an unregulated model burst with initial overshoot and an average model burst formed therefrom.

In this connection, it should be noted that the factor $<E_{i+1}(j)>/<E_i(j)>$ is in many cases approximately equal to one. According to the example in FIG. 6a:

$$<E_{i+1}(j)>/<E_i(j)> \approx 1 +$$

(max. overshoot)/(quantity of overshoot pulses)

$$\approx 1 + 20\%/50 = 1.004.$$

FIG. 6a shows by way of example a model burst (solid curve) measured in unregulated operation and an average model burst (dashed line) with an overshoot of 20% and a stationary pulse energy of 10 mj adjusted after the break-in phase of approximately 50 pulses.

Figure 6B:
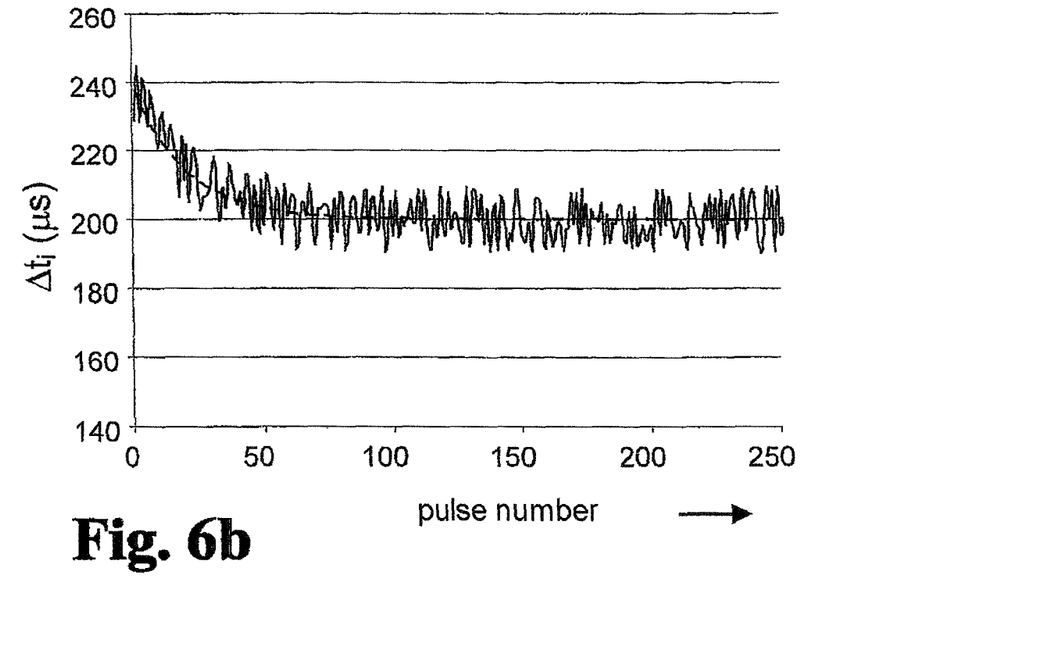
FIG. 6b illustrates the calculated pulse intervals $\Delta_{ti+1}$ for compensating the pulse energy overshoot from FIG. 6a for a burst with constant average radiation output.

FIG. 6b shows—at a nominal pulse repetition frequency $f_0$ of 5 kHz that is preselected for the radiation source 1—all of the pulse intervals $\Delta t_i(k)$ calculated according to Equation (8) in burst k for achieving an average radiation output $\overline{P}_i(k)$ without overshoot. As can be clearly seen, the pulse intervals at the start of the burst are increased corresponding to the height of the overshoot and, over the course of about 50 pulses, increasingly approach the nominal pulse repetition frequency $f_0$.

The charge voltage remains constant in this procedure and is adjusted in such a way that the radiation source 1 is operated in a regime that is optimal for the emission conditions and for longevity and the necessary average pulse energy for adjusting the required radiation dose on the wafer is sufficient. In addition, in the present case, the gas supply is adjusted in such a way that optimal discharge conditions are maintained in the radiation generation unit 12.

Accordingly, in the regulation according to the invention for overshoot compensation, all of the manipulated variables for controlling the individual energy pulse in the radiation generation unit 12—as they were optimally adjusted for the long-term operation of the radiation source 1—are maintained constant.

In order to compensate for the deviations of the current pulse energy $E_i$ from its target value $E_0$ (i.e., to adjust a constant average radiation output $\overline{P}_i$ in a burst with approximately 50 initial overshoot pulses), the fast regulation processes for adapting the pulse intervals $\Delta t_i$ between the individual pulses, i.e., an adaptive pulse frequency control, are used exclusively, i.e., without conventional pulse energy regulation.

While the foregoing description and drawings represent the present invention, it will be obvious to those skilled in the art that various changes may be made therein without departing from the true spirit and scope of the present invention.

REFERENCE NUMBERS

1 radiation source
11 trigger
12 radiation generation unit
2 control loop
21 measuring unit
22 control unit
3 (lithography) exposure system 31 optical transmission systems
$E_0$ target value of the pulse energy
$E_i$ pulse energy
66 $t_i$, $\Delta t_{i+1}$ pulse interval
$f_0$ (nominal) repetition frequency
j model burst (unregulated)
k current burst
$\overline{P}_i$ average radiation output
$<E_i(j)>$ average model burst (unregulated)

What is claimed is:

1. A method for stabilizing the average emitted radiation output of a pulsed radiation source, the method comprising the following steps:
   measuring the individual pulse energy ($E_i$) of a current radiation pulse;
   determining the deviation $\Delta E = E_i - E_0$ of the current radiation pulse energy ($E_i$) from a previously determined target value ($E_0$) of an individual pulse energy; and
   controlling an individual pulse spacing within a sequence of pulses, where the pulse period ($\Delta t_{i+1}$) preceding the triggering of a next radiation pulse, which follows the current radiation pulse, depends on the magnitude of the deviation of the current individual pulse energy ($E_i$) from the target value ($E_0$) of the pulse energy;
   wherein the individual pulse spacing ($\Delta t_{i+1}$) is determined from the average repetition frequency ($f_0$) of the individual pulses, the required target value of the pulse energy ($E_0$), and the measured individual pulse energy ($E_i$) of the current pulse using the calculation rule $\Delta t_{i+1} = E_i/(f_0 \cdot E_0)$.

2. The method according to claim 1;
   wherein by a timely programming of a fast trigger, the greater the amount by which the current individual pulse energy ($E_i$) falls below the target value ($E_0$), the sooner the next pulse is triggered, and the greater the amount by which the current individual pulse energy ($E_i$) exceeds the target value ($E_0$), the later the next pulse is triggered.

3. The method according to claim 1;
   wherein a lithography exposure system having a window function which determines the quantity of individual pulses and the extent of their effect and how the radiation intensity is distributed along a scan axis is used for wafer exposure, wherein the window function has no steeply rising or falling edges of radiation intensity.

4. The method according to claim 3;
   wherein the window function is defined from the spatial distribution of the radiation intensity of an individual pulse relative to the scan axis w ($x-x_0$) such that $\int w(x-x_0)dx = 1$, where the location x is replaced by the product of scan speed v multiplied by time t, and the total radiation dose D at a determined location on a wafer is calculated as:

$$D = \int w(v \cdot t - v \cdot t_0) P(t) dt$$
   $$= \sum w(v \cdot t_i - v \cdot t_0) E_i.$$

5. The method according to claim 3;
   wherein a Gauss function over at least 30 pulses is used as a window function.

6. The method according to claim 3;
   wherein a triangular function over at least 30 pulses is used as a window function.

7. The method according to claim 3;
   wherein a trapezoidal function over at least 30 pulses is used as a window function.

8. The method according to claim 1;
   wherein in order to compensate for an overshoot or undershoot behavior of the pulse energy within the initial phase of a burst, the average radiation output ($\overline{P}_i(k)$) in the current burst (k) is applied using previously stored pulse energy values ($E_i(j)$) of at least one unregulated model burst (j), and the individual pulse spacings ($\Delta t_{i+1}(k)$) are calculated therefrom corresponding to the deviation from the adjustable average pulse energy ($E_0$).

9. The method according to claim 8;
   wherein an unregulated model burst (j) is recorded and stored beforehand under the same initial conditions and with the same burst pattern as the current burst (k) to be regulated.

10. The method according to claim 8;
    wherein model bursts (j) are generated and stored in a separate calibrating regime with a plurality of different initial conditions and rigidly predetermined burst patterns.

11. The method according to claim 10;
    wherein the radiation generation unit (12) is operated with rigidly predetermined values of the charge voltage and gas conditions for recording the pulse energy values of model bursts (j).

12. The method according to claim 1;
    wherein the method is performed by an arrangement for stabilizing the average radiation output of a pulsed radiation source comprising:
    a radiation generation unit which generates individual radiation pulses, including the current radiation pulse and the next radiation pulse, at high pulse rates;
    a measuring unit which measures the pulse energy of every individual radiation pulse, including the current radiation pulse and the next radiation pulse;
    a closed control loop which controls influencing variables of the radiation generation unit which controls the next radiation pulse based on the pulse energy measurements of the current radiation pulse;
    a control unit which regulates the individual pulse spacing, the control unit being connected to the measuring unit and having, at an output, a control signal which is generated based on the deviation of the measured individual pulse energy ($E_i$) of the current radiation pulse from the target value ($E_0$) of the individual pulse energy, the control signal representing a measure for a reference value of the pulse period ($\Delta t_{i+1}$) between the next radiation pulse and the current radiation pulse; and
    a programmable trigger which quickly changes the time for triggering the pulse, the programmable trigger being arranged between the control unit and the radiation generation unit, and being capable of altering the time point of the triggering of the next radiation pulse relative to a nominal pulse frequency ($f_0$) of the individual radiation pulses depending on the output signal of the control unit.

13. The method according to claim 12;
    wherein the measuring unit is arranged in a separate measurement channel of the radiation source, wherein at least the etendue of optical transmission systems of an exposure system which are provided between the radiation generation unit and a location where the radiation is applied is equivalently simulated in the separate measurement channel.

14. The method according to claim 12;
wherein the measuring unit is arranged downstream of optical transmission systems which are provided between the radiation generation unit and a location where the radiation is applied in order to acquire the true yield of pulse energy of the current pulse at the point of application.

15. The method according to claim 12;
wherein the measuring unit in a lithography exposure system for semiconductor chip fabrication is arranged in the vicinity of the surface of a wafer to be exposed.

16. The method according to claim 12;
wherein the measuring unit in a lithography exposure system for semiconductor chip fabrication is arranged in the vicinity of a mask to be imaged on a wafer to be exposed.

17. The method according to claim 12;
wherein the measuring unit is formed by a detector system which is arranged in a conjugate wafer plane in a lithography exposure system for semiconductor chip fabrication, wherein the detector system is provided for other measurement tasks and is additionally connected to the control unit of the radiation source for recording and transmitting the pulse energy value ($E_i$) of the individual radiation pulses.

18. A method for stabilizing the average emitted radiation output of a pulsed radiation source, the method comprising the following steps:
measuring the individual pulse energy ($E_i$) of a current radiation pulse;
determining the deviation $\Delta E = E_i - E_0$ of the current radiation pulse energy ($E_i$) from a previously determined target value ($E_0$) of an individual pulse energy; and
controlling an individual pulse spacing within a sequence of pulses, where the pulse period ($\Delta t_{i+1}$) preceding the triggering of a next radiation pulse, which follows the current radiation pulse, depends on the magnitude of the deviation of the current individual pulse energy ($E_i$) from the target value ($E_0$) of the pulse energy;
wherein in order to compensate for an overshoot or undershoot behavior of the pulse energy within the initial phase of a burst, the average radiation output ($\overline{P}_i(k)$) in the current burst (k) is applied using previously stored pulse energy values ($E_i(j)$) of at least one unregulated model burst (j), and the individual pulse spacings ($\Delta t_{i+1}(k)$) are calculated therefrom corresponding to the deviation from the adjustable average pulse energy ($E_0$);
wherein the individual pulse spacing preceding the next pulse is determined according to the equation $$\Delta t_{i+1}(k) = \frac{1}{f_0} \cdot \frac{E_i(k)}{E_0} \cdot \frac{<E_{i+1}(j)>}{<E_i(j)>},$$

and
wherein at least pulse energy values ($E_i(j)$) of an unregulated model burst (j) are used as averaged pulse energy values ($<E_i(j)>$).

19. The method according to claim 18;
wherein averaged pulse energy values ($E_1(j)$) from a plurality of unregulated model bursts (j) are used as averaged pulse energy values ($<E_i(j)>$).

* * * * *